United States Patent
Oda

(10) Patent No.: US 8,130,500 B2
(45) Date of Patent: Mar. 6, 2012

(54) THERMAL CONDUCTIVE MEMBER, MANUFACTURING METHOD OF THE THERMAL CONDUCTIVE MEMBER, HEAT RADIATING COMPONENT, AND SEMICONDUCTOR PACKAGE

(75) Inventor: Takuya Oda, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 12/892,075

(22) Filed: Sep. 28, 2010

(65) Prior Publication Data

US 2011/0090650 A1    Apr. 21, 2011

(30) Foreign Application Priority Data

Oct. 20, 2009    (JP) .................. 2009-241684

(51) Int. Cl.
*H05K 7/20* (2006.01)

(52) U.S. Cl. ........ 361/710; 361/709; 361/717; 165/185; 428/408

(58) Field of Classification Search .......... 361/700–711, 361/717–722

See application file for complete search history.

(56) References Cited

U.S. PATENT DOCUMENTS

| 5,660,917 | A  | * | 8/1997  | Fujimori et al. ............ 428/195.1 |
| 6,821,625 | B2 | * | 11/2004 | Chu et al. ........................ 428/408 |
| 7,168,484 | B2 | * | 1/2007  | Zhang et al. ................... 165/185 |
| 2006/0234056 | A1 | * | 10/2006 | Huang et al. ................... 428/408 |
| 2007/0090387 | A1 | * | 4/2007  | Daniels et al. ................... 257/99 |
| 2009/0237886 | A1 | * | 9/2009  | Iwai et al. ...................... 361/708 |
| 2010/0124025 | A1 | * | 5/2010  | Yamaguchi et al. .......... 361/708 |

FOREIGN PATENT DOCUMENTS

| JP | 2008-210954 | 9/2008 |
| JP | 2008-258547 | 10/2008 |
| JP | 2009-170828 | 7/2009 |

\* cited by examiner

*Primary Examiner* — Courtney Smith
(74) *Attorney, Agent, or Firm* — IPUSA, PLLC

(57) ABSTRACT

A thermal conductive member includes linear high thermal conductivity materials; a first solder layer provided at first end sides of the linear high thermal conductivity materials; and a second solder layer provided at second end sides of the linear high thermal conductivity materials; wherein at least one of the first end sides and the second end sides of the linear high thermal conductivity materials are connected to the first solder layer or the second solder layer.

7 Claims, 11 Drawing Sheets

THERMAL CONDUCTIVE MEMBER, MANUFACTURING METHOD OF THE THERMAL CONDUCTIVE MEMBER, HEAT RADIATING COMPONENT, AND SEMICONDUCTOR PACKAGE

CROSS-REFERENCE TO RELATED APPLICATIONS

This patent application is based upon and claims the benefit of priority of Japanese Patent Application No. 2009-241684 filed on Oct. 20, 2009, the entire contents of which are incorporated herein by reference.

BACKGROUND OF THE INVENTION

1. Field of the Invention

The present invention generally relates to thermal conductive members, manufacturing methods of the thermal conductive members, heat radiating components, and semiconductor packages. More specifically, the present invention relates to a thermal conductive member used for radiating heat from a semiconductor element, a manufacturing method of the thermal conductive member, a heat radiating component using the thermal conductive member, and a semiconductor package using the thermal conductive member.

2. Description of the Related Art

A semiconductor element used for a CPU (Central Processing Unit) or the like is electrically connected and fixed onto a board in a semiconductor package. Since the semiconductor package has a high temperature at the time of operating, if the temperature of the semiconductor element is not decreased forcibly, not only full play is not given to the semiconductor ability, but the semiconductor element may be broken. Therefore, by providing a heat radiating plate (heat sink) or a heat radiating fin (or heat pipe) on the semiconductor element, heat generated by the semiconductor element is effectively radiated to the outside. The following structure has been suggested. That is, a TIM (Thermal Interface Material) is sandwiched between the semiconductor element and the heat radiating plate or the like, so that contact heat resistance is reduced due to the TIM following concave and convex surfaces of each of the semiconductor element and the heat radiating plate and thermal conductivity is thereby increased.

FIG. 1 is a cross-sectional view showing an example of a related art heat radiating component provided on a semiconductor package. In the semiconductor package, heat is generated by a semiconductor element 200 provided on a board 100. The heat is transferred to a heat radiating plate 400 via a thermal conductive member 300 provided on the semiconductor element 200. In addition, heat transferred to the heat radiating plate 400 is transferred to a heat radiating fin 500 via the thermal conductive member 300 provided on the heat radiating plate 400.

Thus, the thermal conductive member 300 is used as a part configured to efficiently and thermally connect the semiconductor element 200 and the heat radiating plate 400 to each other or the heat radiating plate 400 and the heat radiating fin 500 to each other.

Indium having a good thermal conductivity is frequently used as a material of the thermal conductive member 300. However, since Indium is a rare metal and expensive, there could be a future supply problem. Because of this, as another example of the thermal conductive member 300, silicon grease, an organic resin binder including a metal filler or graphite as a high thermal conductivity material, or the like is used. A resin molded sheet where carbon nanotubes are arranged in a thermal conductive direction has been known as the thermal conductive member 300. See Japanese Patent Application Publication No. 2008-258547, Japanese Patent Application Publication No. 2009-170828, and Japanese Patent Application Publication No. 2008-210954.

However, the thermal conductive member 300 made of the organic resin binder including the metal filler or graphite using resin as a binder may have a heat radiating capability problem because the thermal conductivity of the resin is not high. In addition, in the carbon nanotubes arranged in a thermal conductive direction, contact heat resistance between carbon nanotube end surfaces and the heat radiating component is large so that expected capabilities may not be realized. This is because short carbon nanotubes cannot reach the surface of the heat radiating component.

For example, FIG. 2 is a cross-sectional view showing an example of a contact surface of a thermal conductive member including a high thermal conductivity material and the related art heat radiating component. As shown in FIG. 2(a) and FIG. 2(b), the contact surface between the thermal conductive member 300a and the heat radiating plate 400 is rough in a microscopic view, and spaces 600 are formed between the contact surfaces of the thermal conductive member 300a and the heat radiating plate 400.

In an example shown in FIG. 2(a), the thermal conductive member 300a has a structure where an outermost surface of a high thermal conductivity material 302a is covered with a low thermal conductivity material layer 301a whose resin ratio is high. In this case, there is no physical contact between the heat radiating plate 400 and the high thermal conductivity material 302a such as metal filler or graphite, and the contact thermal resistance between the heat radiating plate 400 and the high thermal conductivity material 302a is large. Hence, the thermal conductivity may be low and the heat transfer may not be good.

In an example shown in FIG. 2(b), a thermal conductive member 300b has a structure where carbon nanotubes as high thermal conductivity materials 302b are fixed by a low thermal conductivity material layer 301b such as a resin binder. In this case, since there is great unevenness of the lengths of the high thermal conductivity materials 302b, short high thermal conductivity materials 302b do not reach the surface of the heat radiating plate 400. Hence, in this case, as well as the case shown in FIG. 2(a), the contact thermal resistance between the heat radiating plate 400 and the high thermal conductivity materials 302b is large. Hence, the thermal conductivity may be low and the heat transfer may not be good.

SUMMARY OF THE INVENTION

Accordingly, embodiments of the present invention may provide a novel and useful thermal conductive member, a manufacturing method of the thermal conductive member, a heat radiating component, and a semiconductor package solving one or more of the problems discussed above.

More specifically, the embodiments of the present invention may provide a thermal conductive member having a high thermal conductivity and good heat radiating capabilities, a manufacturing method of the thermal conductive member, a heat radiating component using the thermal conductive member, and a semiconductor package using the thermal conductive member.

Another aspect of the embodiments of the present invention may be to provide a thermal conductive member includes linear high thermal conductivity materials; a first solder layer provided at first end sides of the linear high thermal conductivity materials; and a second solder layer provided at second end sides of the linear high thermal conductivity materials; wherein at least one of the first end sides and the second end sides of the linear high thermal conductivity materials are connected to the first solder layer or the second solder layer.

Another aspect of the embodiments of the present invention may be to provide a heat radiating component, including the above-mentioned thermal conductive member; and a heat radiating plate, wherein a metal layer is formed on at least a portion of one of surfaces of the heat radiating plate; and the first solder layer or the second solder layer is made molten so that the metal layer and the first solder layer or the second solder layer of the thermal conductive member are chemically connected to each other.

Another aspect of the embodiments of the present invention may be to provide a semiconductor package, including the above-mentioned thermal conductive member; and a semiconductor element and a heat radiating plate which face each other via the thermal conductive member, wherein metal layers are formed on at least a portion of one of surfaces of the semiconductor element and on at least a portion of one of surfaces of the heat radiating plate; the first solder layer or the second solder layer is made molten so that the metal layer of the semiconductor element and the first solder layer or the second solder layer of the thermal conductive member are chemically connected to each other; and the first solder layer or the second solder layer is made molten so that the metal layer of the heat radiating plate and the first solder layer or the second solder layer of the thermal conductive member are chemically connected to each other.

Another aspect of the embodiments of the present invention may be to provide a manufacturing method of a thermal conductive member, including providing first high thermal conductivity materials having first end sides where a first solder layer is formed and second high thermal conductivity materials having second end sides where a second solder layer is formed, so that the first high thermal conductivity materials and the second high thermal conductivity materials are alternately situated, and the first high thermal conductivity materials are situated in respective gaps formed between the neighboring second high thermal conductivity materials and the second high thermal conductivity materials are situated in respective gaps formed between the neighboring first high thermal conductivity materials.

Additional objects and advantages of the embodiments are set forth in part in the description which follows, and in part will become obvious from the description, or may be learned by practice of the invention. The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

A description is given below, with reference to the FIG. 3 through FIG. 15 of embodiments of the present invention.

First Embodiment (Structure of Thermal Conductive Member)

Figure 1:
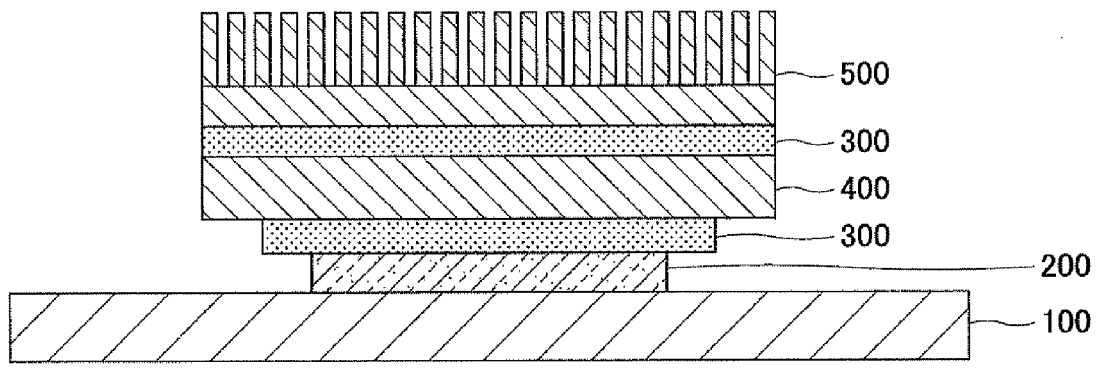
FIG. 1 is a cross-sectional view showing an example of a related art heat radiating component provided on a semiconductor package.
Figure 2:
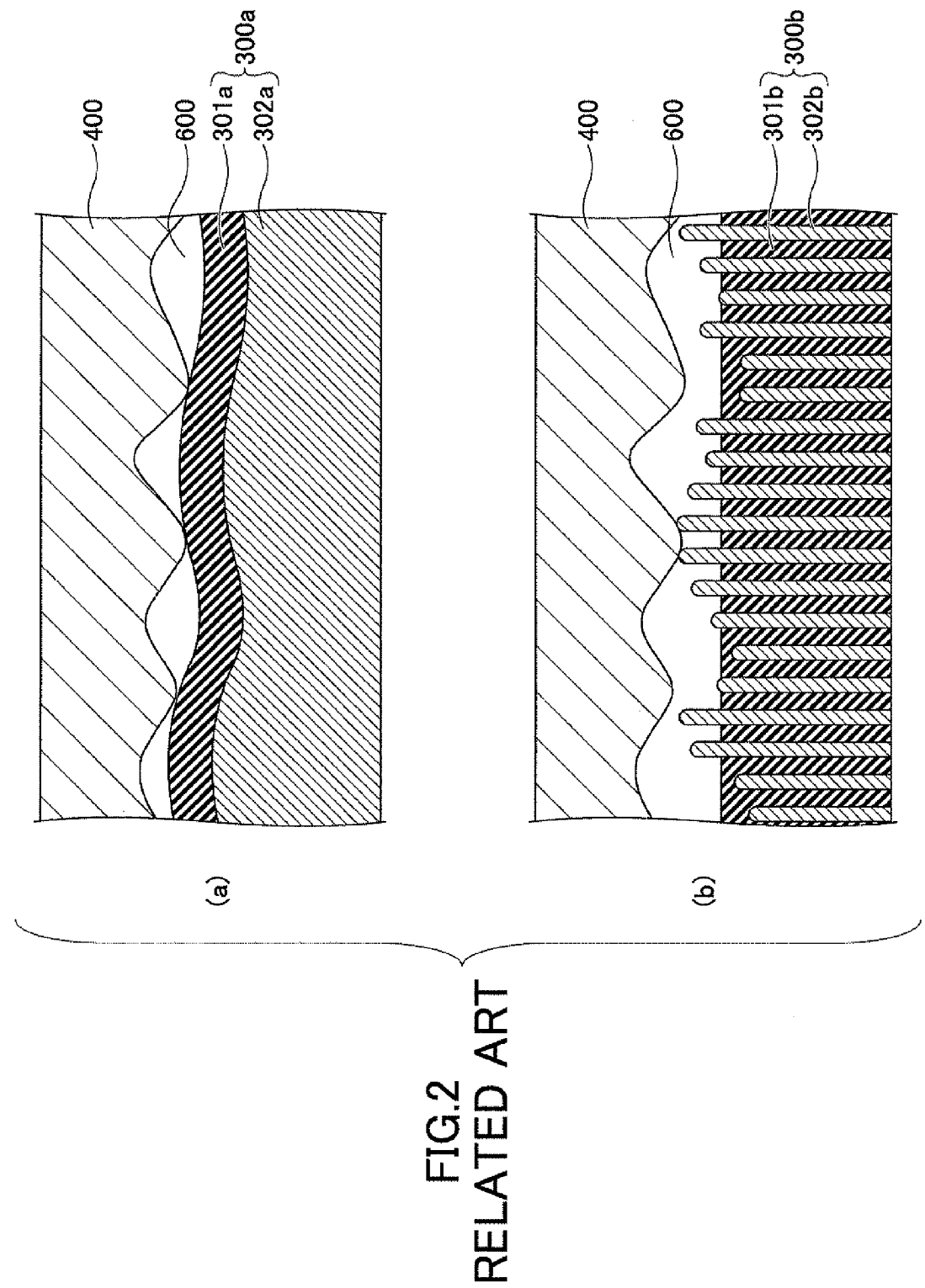
FIG. 2 is a cross-sectional view showing an example of a contact surface of a thermal conductive member including a high thermal conductivity material and the related art heat radiating component.
Figure 3:
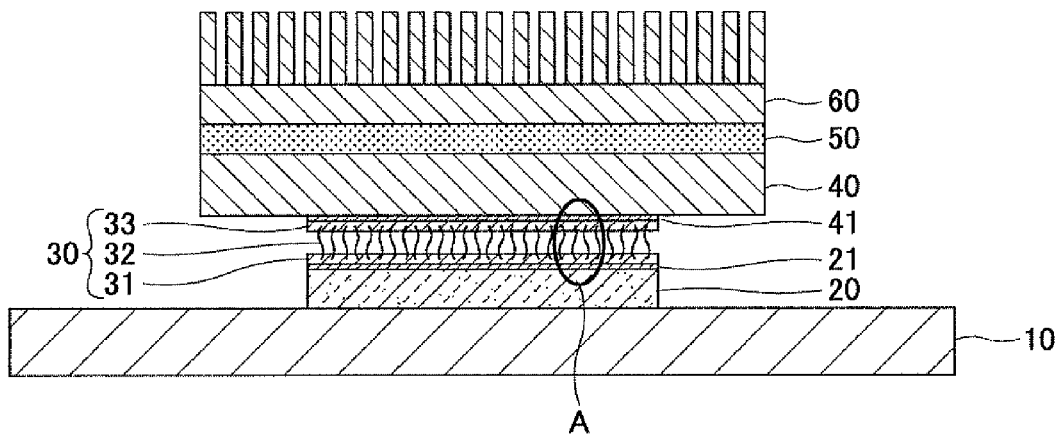
FIG. 3 is a cross-sectional view showing an example of a thermal conductive member of a first embodiment of the present invention provided on a semiconductor package.
Figure 4:
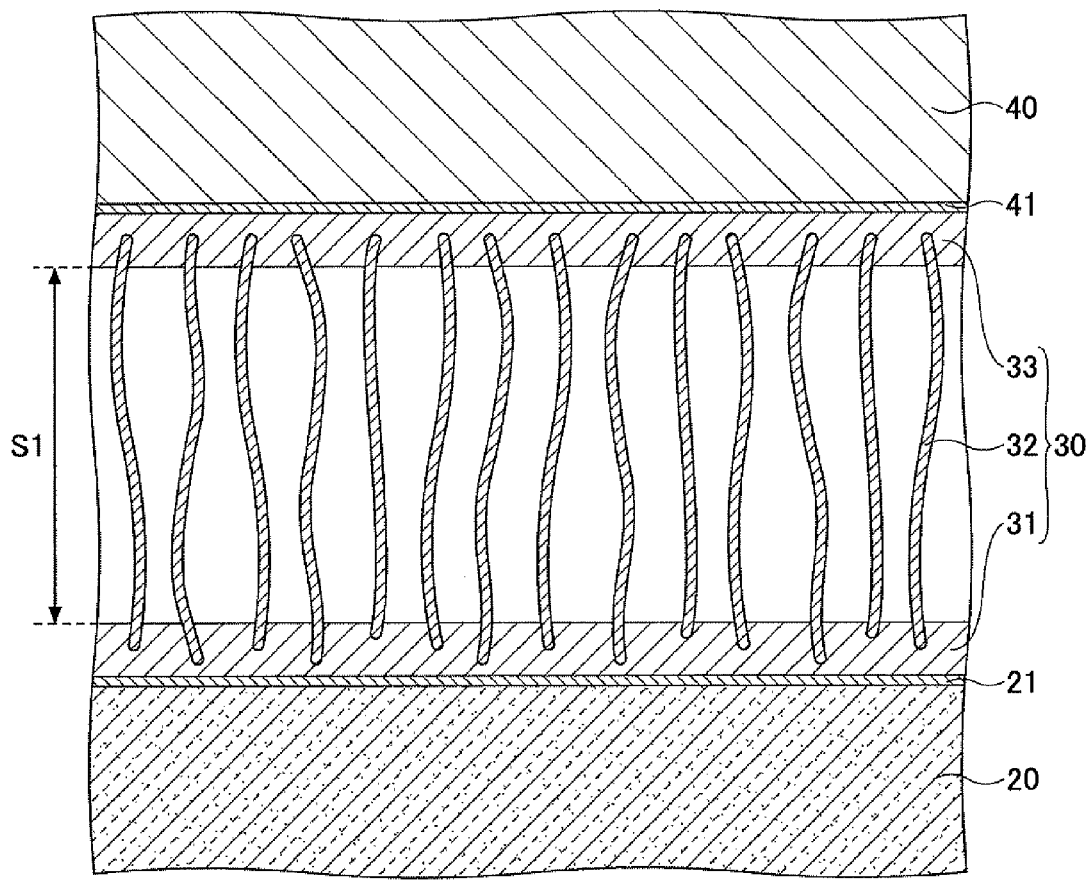
FIG. 4 is an expanded cross-sectional view of a portion A shown in FIG. 3.

FIG. 3 is a cross-sectional view showing an example of a thermal conductive member of a first embodiment of the present invention provided on a semiconductor package. FIG. 4 is an expanded cross-sectional view of a portion A shown in FIG. 3.

As shown in FIG. 3, a thermal conductive member 30 of the first embodiment includes a first solder layer 31, carbon nanotubes 32, and a second solder layer 33. The first solder layer 31 of the thermal conductive member 30 is connected to a metal layer 21 formed on an upper surface of a semiconductor element 20 mounted on a board 10. The second solder layer 33 of the thermal conductive member 30 is connected to a metal layer 41 formed on a rear surface of a heat radiating plate 40. As materials of the metal layers 21 and 41, metal having a good wettability with solder can be used. As a material of the metal layers 21 and 41, for example, Au or the like can be used. The metal layers 21 and 41 may be, for example, a Ni/Au layer where Ni and Au are stacked, in this order, or a Ni/Pd/Au layer where Ni, Pd, and Au are stacked, in this order. The thickness of the metal layer 21 and the metal layer 41 can be approximately 0.05 μm. Thus, by providing the thermal conductive member 30 between the semiconductor element 20 and the heat radiating plate 40, the semiconductor element 20 and the heat radiating plate 40 can be thermally connected to each other.

When the semiconductor element 20 is operated, it is heated to approximately 100° C., through approximately 110° C. The heat generated by the semiconductor element 20 is transferred to the heat radiating plate 40 via the thermal conductive member 30 provided on the semiconductor element 20. The thermal conductive member 30 efficiently and thermally connects the semiconductor element 20 and the heat radiating plate 40 to each other. The heat transferred to the heat radiating plate 40 is diffused by the heat radiating plate 40 and the heat is transferred to the heat radiating fin 60 via a thermal conductive member 50 provided on the heat radiating plate 40 so as to be transferred to the outside.

A TIM (Thermal Interface Material) including metal filler, graphite, or the like can be used as the thermal conductive member 50. The thermal conductive member 30 of the first embodiment of the present invention may be used as the thermal conductive member 50.

A heat spreader, for example, can be used as the heat radiating plate 40. The heat radiating plate 40 is made of, for example, a material having high thermal conductivity such as aluminum or oxygen free copper where nickel plating is applied. The heat radiating plate 40 is configured to transfer heat generated by the semiconductor element 20 and radiate the heat to the outside. In addition, since the heat radiating plate 40 is provided on the semiconductor element 20, the heat radiating plate 40 is configured to mechanically protect the semiconductor element 20. The heat radiating plate 40 has a square-shaped configuration for which one side is, for example, approximately 10 mm through approximately 40 mm. The heat radiating plate 40 has a thickness of, for example, approximately 0.5 mm through approximately 3 mm.

Details of the thermal conductive member 30 are discussed with reference to FIG. 4. In the thermal conductive member 30, first ends of the carbon nanotubes 32 are connected to a material forming the first solder layer 31. Second ends of the carbon nanotubes 32 are connected to a material forming the second solder layer 33. As the first solder layer 31 and the second solder layer 33, for example, a relatively soft material such as Indium solder may be used or a relatively hard material such as Sn group solder can be used. Thicknesses of the first solder layer 31 and the second solder layer 33 can be, for example, approximately 5 µm through approximately 100 µm. A gap S1 between the first solder layer 31 and the second solder layer 33 can be, for example, approximately 50 µm through approximately 200 µm.

The carbon nanotubes 32 stand (bristle) in a thermal conductive direction (a direction substantially perpendicular to the first solder layer 31 and the second solder layer 33) between the first solder layer 31 and the second solder layer 33. The carbon nanotube 32 is a substantially cylindrical-shaped carbon crystal having a diameter of approximately 0.7 nm through approximately 70 nm. The carbon nanotube 32 has a high thermal conductivity. The thermal conductivity of the carbon nanotube 32 is, for example, 3000 W/(m·K). In other words, the carbon nanotube 32 is a linear high thermal conductivity material.

Resin may be supplied to fill a space part formed by neighboring carbon nanotubes 32 between the first solder layer 31 and the second solder layer 33. However, this is not mandatory.

(Manufacturing Method of the Thermal Conductive Member)

Next, a manufacturing method of the thermal conductive member 30 of the first embodiment is discussed. FIG. 5 through FIG. 8 are views of an example of a manufacturing process of the thermal conductive member 30 of a first embodiment of the present invention. In FIG. 5 through FIG. 8, parts that are the same as the parts shown in FIG. 3 and FIG. 4 are given the same reference numerals, and explanation thereof is omitted.

Figure 5:
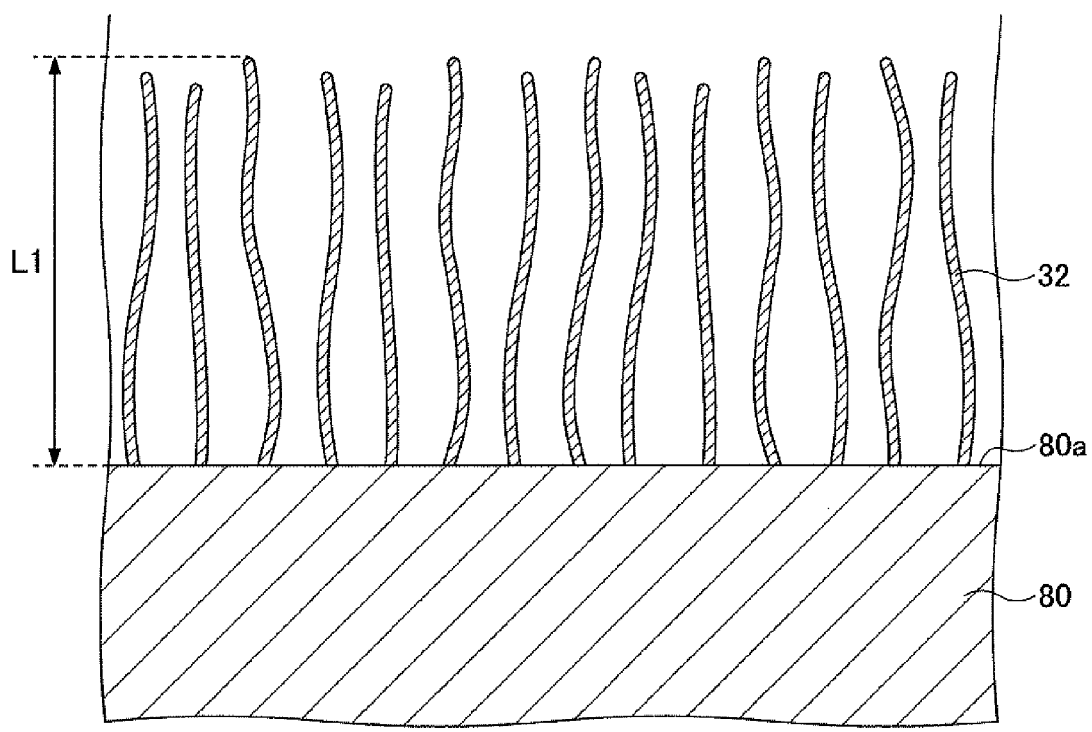
FIG. 5 is a first view showing an example of a manufacturing process of the thermal conductive member of a first embodiment of the present invention.

First, in a step shown in FIG. 5, a base member 80 is provided. A large number of carbon nanotubes 32 are formed on a surface 80*a* of the base member 80. As the base member 80, for example, plate-shaped copper (Cu), silicon (Si), or the like can be used.

More specifically, first, a metal catalyst layer is formed on a surface 80*a* of the base member 80 by a sputtering method or the like. As the metal catalyst layer, for example, Fe, Co, Ni and other metals can be used. The thickness of the metal catalyst layer can be, for example, approximately several nm.

Next, the base member 80 where the metal catalyst layer is formed is put into a heating furnace whose pressure and temperature are adjusted. By applying a CVD (Chemical Vapor Deposition) method, the carbon nanotubes 32 are formed on the metal catalyst layer. The pressure and temperature of the heating furnace can be, for example, approximately 0.1 kPa through approximately 1.0 kPa and approximately 500° C. through approximately 800° C. In addition, as process gas, for example, acetylene gas can be used. As carrier gas, for example, argon gas or hydrogen gas can be used.

The carbon nanotubes 32 are formed on the metal catalyst layer in a direction perpendicular to the surface 80*a* of the base member 80, the length L1 between the surfaces 80*a* and the head end parts of the carbon nanotubes 32 can be controlled by a growing time of the carbon nanotubes 32.

Next, the first solder layer 31 is formed at first end sides of the carbon nanotubes 32. As a material of the first solder layer 31, a relatively soft material such as Indium solder or a relatively hard material such as Sn group solder may be used. The first solder layer 31 can be formed by, for example, a vapor deposition method, a sputtering method, a plating method, or the like. The thickness of the first solder layer 31 can be, for example, approximately 5 µm through approximately 100 µm.

Figure 6:
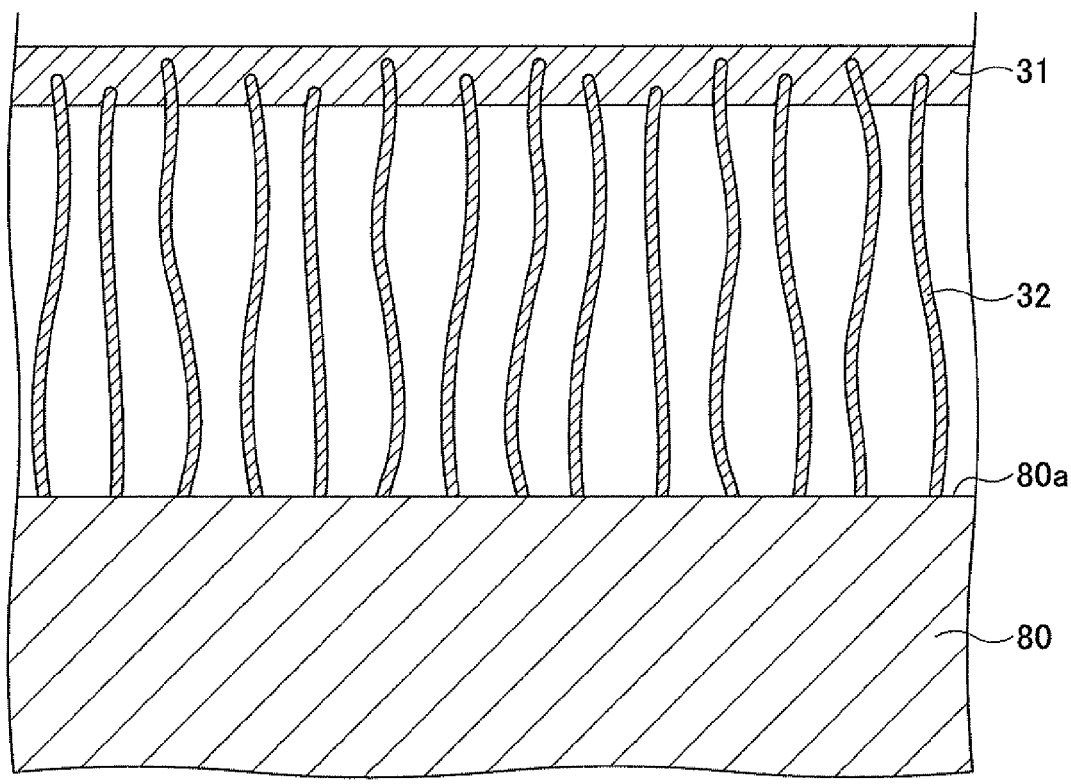
FIG. 6 is a second view showing the example of the manufacturing process of the thermal conductive member of the first embodiment of the present invention.
Figure 7:
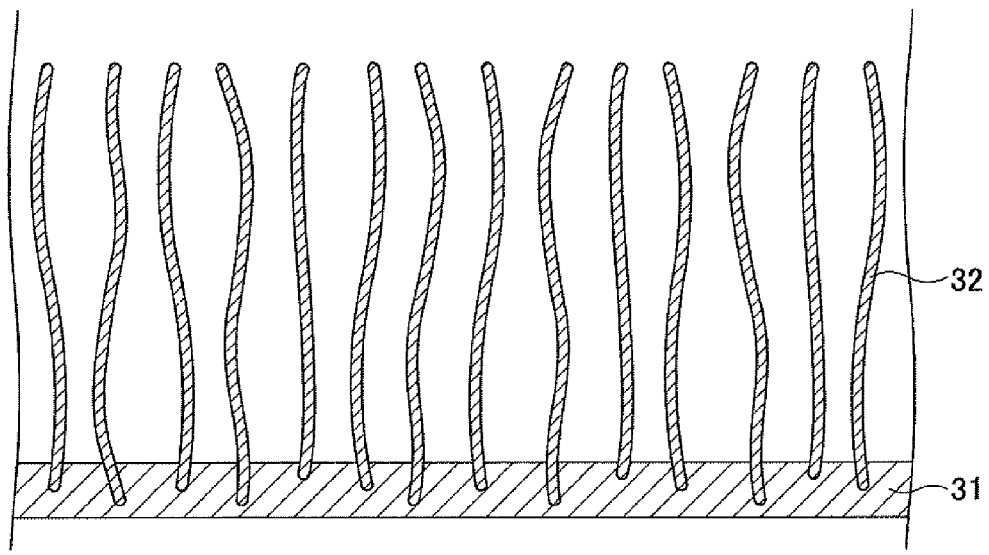
FIG. 7 is a third view showing the example of the manufacturing process of the thermal conductive member of the first embodiment of the present invention.

Next, in a step shown in FIG. 7, the carbon nanotubes 32 having the first end sides where the first solder layer 31 is formed are mechanically peeled off from the base member 80. FIG. 7 is a view upside down relative to FIG. 6.

Figure 8:
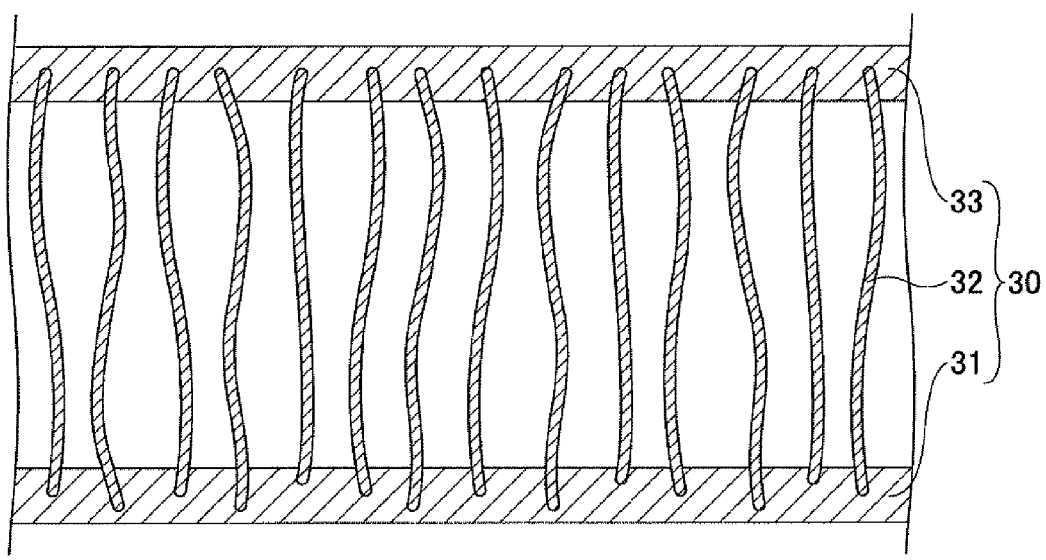
FIG. 8 is a fourth view showing the example of the manufacturing process of the thermal conductive member of the first embodiment of the present invention.

Next, in a step shown in FIG. 8, the second solder layer 33 is formed at second end sides of the carbon nanotubes 32. As a material of the second solder layer 33, a relatively soft material such as Indium solder or a relatively hard material such as Sn group solder may be used. The second solder layer 33 can be formed by, for example, a vapor deposition method, a sputtering method, a plating method, or the like. The thickness of the second solder layer 33 can be, for example, approximately 5 µm through approximately 100 µm. Thus, formation of the thermal conductive member 30 of the first embodiment of the present invention is completed.

The thermal conductive member 30 can be provided at the semiconductor package as follows. FIG. 9 through FIG. 12 are first through fourth views showing an example of a manufacturing process of the semiconductor package of the first embodiment of the present invention. In FIG. 9 through FIG. 12, parts that are the same as the parts shown in FIG. 3 and FIG. 4 are given the same reference numerals, and explanation thereof is omitted.

Figure 9:
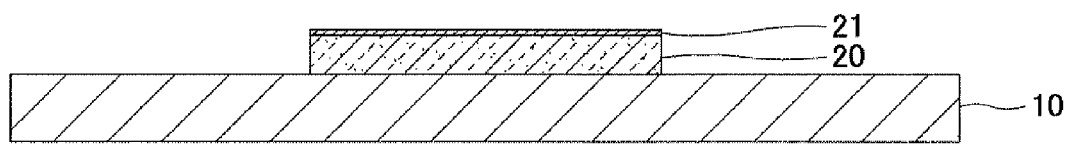
FIG. 9 is a first view showing an example of a manufacturing process of the semiconductor package of the first embodiment of the present invention.

First, in a step shown in FIG. 9, the semiconductor element 20 is provided at the board 10. A metal layer 21 is formed on a surface of the semiconductor element 21.

As material of the metal layer 21, metal having a good wettability with a solder can be used. As a material of the metal layer 21, for example, Au or the like can be used. The metal layers 21 and 41 may be, for example, a Ni/Au layer where Ni and Au are stacked, in this order, or a Ni/Pd/Au layer where Ni, Pd, and Au are stacked, in this order. The thickness of the metal layer 21 can be approximately 0.05 μm. The metal layer 21 can be formed by, for example, a vapor deposition method, a sputtering method, a plating method, or the like.

Figure 10:
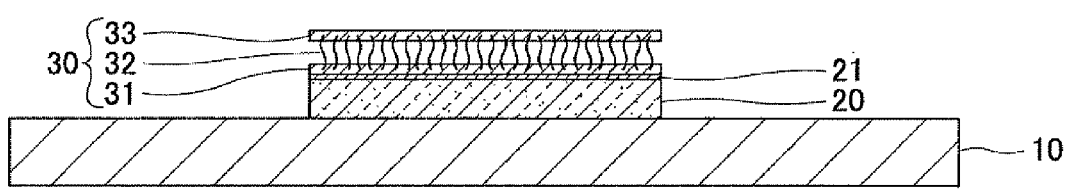
FIG. 10 is a second view showing an example of a manufacturing process of the semiconductor package of the first embodiment of the present invention.

Next, in a step shown in FIG. 10, the thermal conductive member 30 is provided on the metal layer 21 formed on the surface of the semiconductor element 20. The thermal conductive member 30 is provided so that the first solder layer 31 of the thermal conductive member 30 comes in contact with the metal layer 21 formed on the surface of the semiconductor element 20.

Figure 11:
FIG. 11 is a third view showing an example of a manufacturing process of the semiconductor package of the first embodiment of the present invention.

Next, in a step shown in FIG. 11, the heat radiating plate 40 where, for example, nickel plating is applied to oxygen free copper is prepared. A metal layer 41 is formed on the surface of the heat radiating plate 40. As a material of the metal layer 41, metal having good wettability with solder can be used. As a material of the metal layer 41, for example, Au or the like can be used. The metal layers 41 and 41 may be, for example, a Ni/Au layer where Ni and Au are stacked, in this order, or a Ni/Pd/Au layer where Ni, Pd, and Au are stacked, in this order. The thickness of the metal layer 41 can be approximately 0.05 μm. The metal layer 41 can be formed by, for example, a vapor deposition method, a sputtering method, a plating method, or the like.

Figure 12:
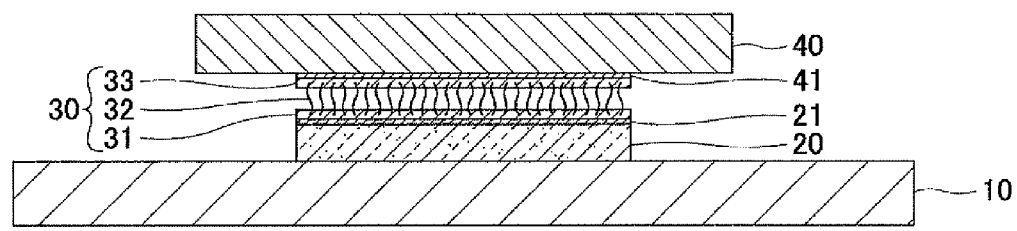
FIG. 12 is a fourth view showing an example of a manufacturing process of the semiconductor package of the first embodiment of the present invention.

While the metal layer 41 may be formed on the entirety of one of the surfaces of the heat radiating plate 40, the metal layer 41 is formed so as to cover at least a portion of the heat radiating plate 40 coming in contact with the second solder layer 33 of the thermal conductive member 30 in a step shown in FIG. 12

Next, in a step shown in FIG. 12, the heat radiating plate 40 having the surface where the metal layer 41 is formed is provided on the thermal conductive member 30. The heat radiating plate 40 is provided so that the metal layer 41 formed on the surface of the heat radiating plate 40 comes in contact with the second solder layer 33 of the thermal conductive member 30. In addition, heating at a temperature equal to or higher than a melting point (for example, approximately 250° C.) of solder materials forming the first solder layer 31 and the second solder layer 33 is applied, so that the first solder layer 31 and the metal layer 21 are made molten so as to be chemically connected to each other; and the second solder layer 33 and the metal layer 41 are made molten so as to be chemically connected to each other. Since the first solder layer 31 and the metal layer 21 are chemically connected to each other and the second solder layer 33 and the metal layer 41 are chemically connected to each other, contact thermal resistance of the semiconductor element 20 and the thermal conductive member 30 and contact thermal resistance of the thermal conductive member 30 and the heat radiating plate 40 can be reduced.

Next, the thermal conductive member 50 and the heat radiating fin 60 are provided on the heat radiating plate 40 by a well-known method, so that formation of a semiconductor package shown in FIG. 3 is completed.

Thus, the thermal conductive member 30 of the first embodiment of the present invention has a structure where the first ends of the carbon nanotubes are connected to the material forming the first solder layer and the second ends of the carbon nanotubes are connected to the material forming the second solder layer. As a result of this, when the thermal conductive member 30 of the first embodiment of the present invention is provided on the semiconductor package, the carbon nanotubes stand in the thermal conductive direction. Therefore, it is possible to improve the thermal conductivity.

In addition, the carbon nanotubes have high mechanical strength and flexibility. Because of this, the carbon nanotubes standing in the thermal conductive direction have elasticity so as to correspond to warping of the semiconductor element when the thermal conductive member is provided on the semiconductor package. Accordingly, it is possible to use the relatively hard material such as the Sn group solder instead of the relatively soft material such as Indium solder. Hence, since it is not necessary to use expensive Indium, the cost of the thermal conductive member can be reduced.

When the thermal conductive member of the first embodiment is provided on the semiconductor package, the first solder layer and the metal layer formed on the semiconductor element are chemically connected to each other by melting the solder. In addition, the second solder layer and the metal layer formed on the heat radiating plate are chemically connected to each other by melting the solder. As a result of this, in this case compared to a case where the thermal conductive member is made merely to come in physical contact with the semiconductor element and the heat radiating plate, the contact thermal resistance can be reduced.

Second Embodiment (Structure of Thermal Conductive Member)

Figure 13:
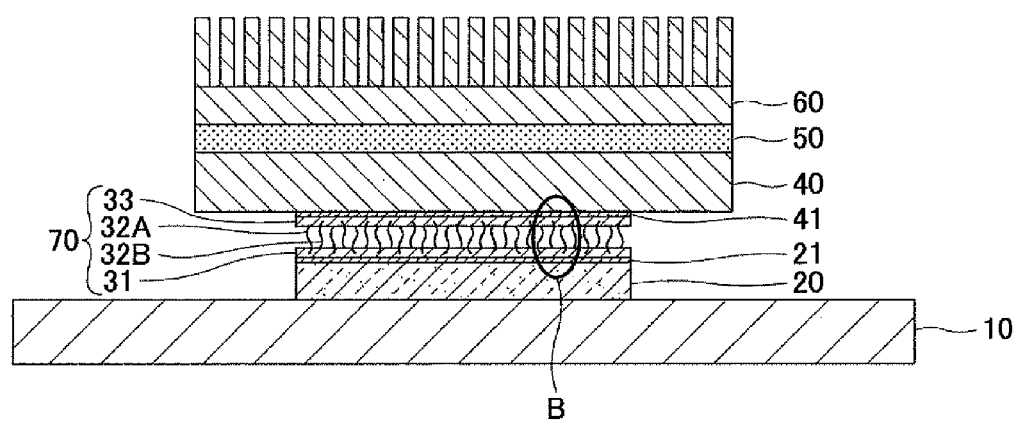
FIG. 13 is a cross-sectional view showing an example of a thermal conductive member of a second embodiment of the present invention provided on a semiconductor package.
Figure 14:
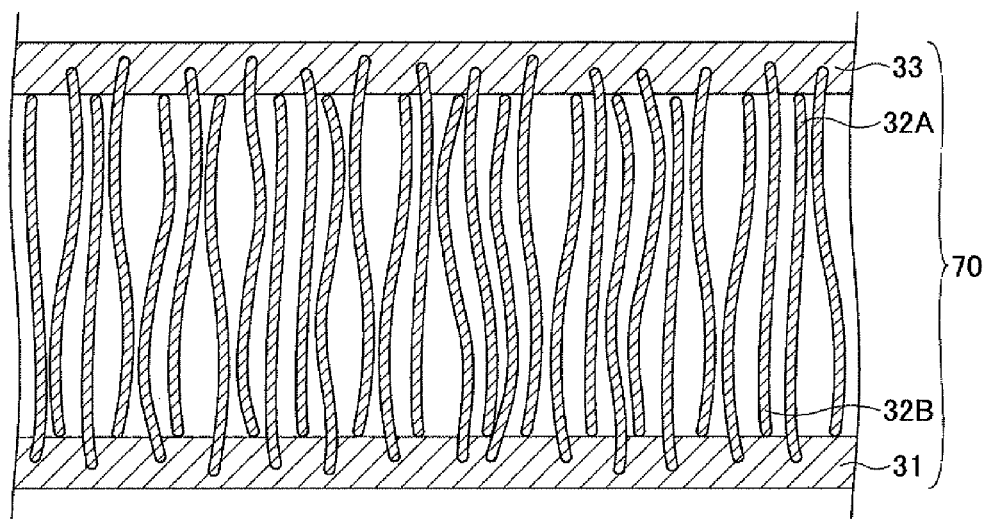
FIG. 14 is an expanded cross-sectional view of a portion B shown in FIG. 13.

FIG. 13 is a cross-sectional view showing an example of a thermal conductive member of a second embodiment of the present invention provided on a semiconductor package. FIG. 14 is an expanded cross-sectional view of a portion B shown in FIG. 13.

As shown in FIG. 13 and FIG. 14, a thermal conductive member 70 of the second embodiment of the present invention has a structure where carbon nanotubes 32A having first end sides where the first solder layer 31 is formed and carbon nanotubes 32B having second end sides where the second solder layer 33 is formed are alternately provided, so that the carbon nanotubes 32A are situated in respective gaps formed between the neighboring carbon nanotubes 32B and the carbon nanotubes 32B are situated in respective gaps formed between the neighboring carbon nanotubes 32A.

In the thermal conductive member 70, the head end part of each of the carbon nanotubes 32A may come in contact with the surface of the second solder layer 33. In addition, in the thermal conductive member 70, the head end part of each of the carbon nanotubes 32B may come in contact with the surface of the first solder layer 31.

The carbon nanotubes 32A and 32B stand (bristle) in a thermal conductive direction (a direction substantially perpendicular to the first solder layer 31 and the second solder layer 33) between the first solder layer 31 and the second solder layer 33. Details of the carbon nanotubes 32A and 32B are the same as the details of the carbon nanotubes 32.

Other parts in the second embodiment are the same as those in the first embodiment and therefore explanation thereof is omitted.

(Manufacturing Method of the Thermal Conductive Member)

Figure 15:
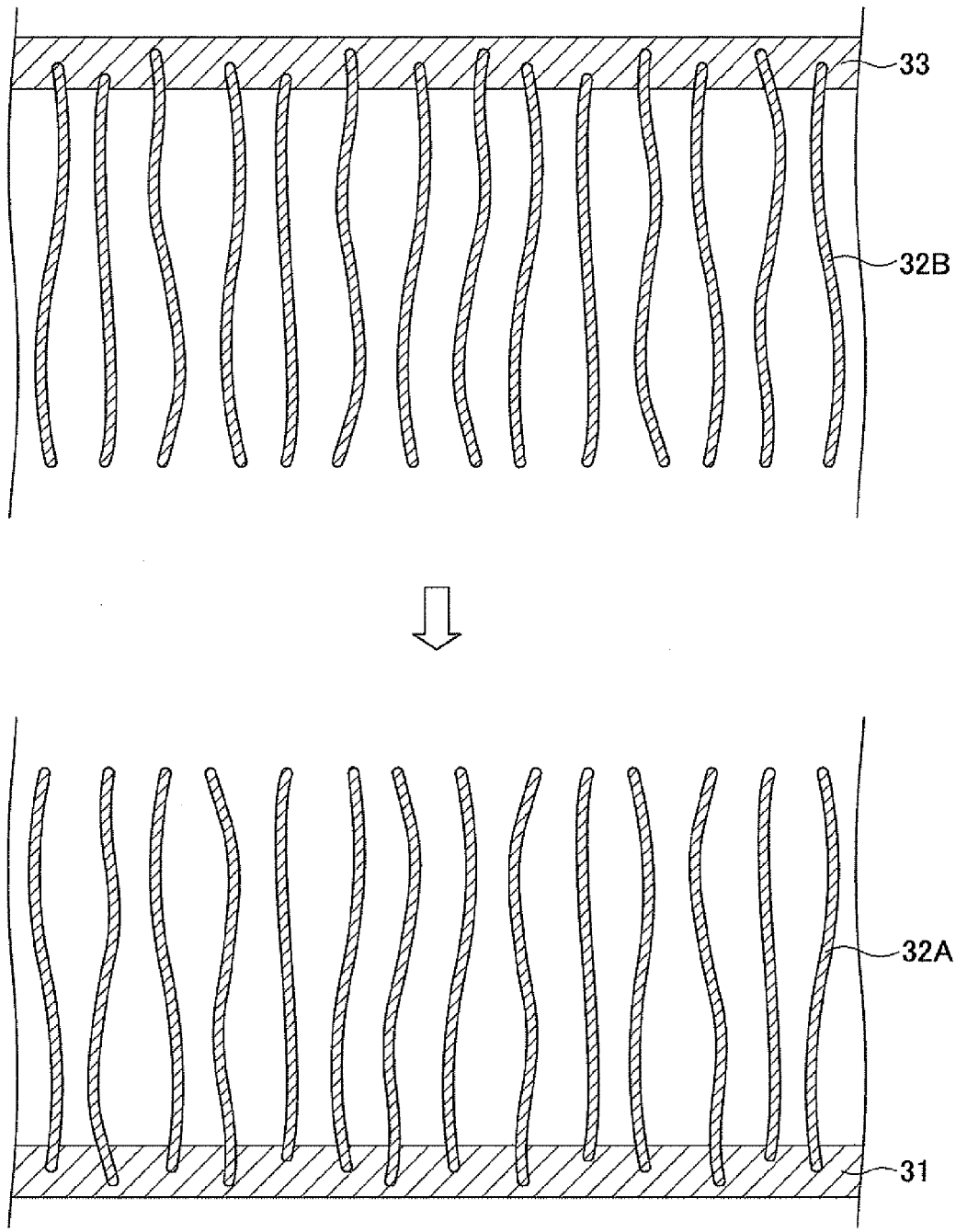
FIG. 15 is a view showing an example of a manufacturing process of the thermal conductive member of the second embodiment of the present invention.

Next, a manufacturing method of the thermal conductive member 70 of the second embodiment is discussed. FIG. 15 is a view showing an example of a manufacturing process of the thermal conductive member 70 of the second embodiment of the present invention. In FIG. 15, parts that are the same as the parts shown in FIG. 13 and FIG. 4 are given the same reference numerals, and explanation thereof is omitted.

First, by the same steps as those of the first embodiment shown in FIG. 5 through FIG. 7, the first solder layer 31 is formed at the first end sides of the carbon nanotubes 32A. In addition, the second solder layer 33 is formed at the second end sides of the carbon nanotubes 32B. As material of the first solder layer 31 and the second solder layer 33, a relatively soft material such as Indium solder or a relatively hard material such as a Sn group solder may be used. The first solder layer 31 and the second solder layer 33 can be formed by, for example, a vapor deposition method or the like. The thickness of the first solder layer 31 and the second solder layer 33 can be, for example, approximately 5 µm through approximately 100 µm.

Next, in a step shown in FIG. 15, the carbon nanotubes 32A having first end sides where the first solder layer 31 is formed and the carbon nanotubes 32B having second end sides where the second solder layer 33 is formed come close to each other, so that the carbon nanotubes 32A having first end sides where the first solder layer 31 are formed and the carbon nanotubes 32B having second end sides where the second solder layer 33 is formed are alternately provided, and the carbon nanotubes 32A are situated in respective gaps formed between the neighboring carbon nanotubes 32B and the carbon nanotubes 32B are situated in respective gaps formed between the neighboring carbon nanotubes 32A. At this time, the head end part of each of the carbon nanotubes 32A may come in contact with a surface of the second solder layer 33. In addition, the head end part of each of the carbon nanotubes 32B may come in contact with a surface of the first solder layer 31. This is to improve the thermal conductivity. Thus, formation of the thermal conductive member 70 shown in FIG. 14 is completed.

The thermal conductive member 70 of the second embodiment can be provided on the semiconductor package by the same way as the thermal conductive member 30 of the first embodiment.

According to the thermal conductive member 70 of the second embodiment of the present invention, the same effect as the thermal conductive member 30 of the first embodiment can be achieved. In addition, the thermal conductive member 70 of the second embodiment further achieves the same effect. In other words, the thermal conductive member 70 of the second embodiment of the present invention has a structure where the carbon nanotubes 32A having first end sides where the first solder layer 31 is formed and the carbon nanotubes 32B having second end sides where the second solder layer 33 is formed are alternately provided, so that the carbon nanotubes 32A are situated in respective gaps formed between the neighboring carbon nanotubes 32B and the carbon nanotubes 32B are situated in respective gaps formed between the neighboring carbon nanotubes 32A. As a result of this, in the thermal conductive member 70 compared to the thermal conductive member 30 of the first embodiment, since the density of the carbon nanotubes is doubled, it is possible to further improve the thermal conductivity.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. A heat radiating component, comprising:
a thermal conductive member which includes linear high thermal conductivity materials,
a first solder layer connected to first end sides of the linear high thermal conductivity materials, and
a second solder layer connected to second end sides of the linear high thermal conductivity materials;
a first metal layer formed under the first solder layer and configured to be formed on a semiconductor element, the first metal layer and the first solder layer being made molten so as to be chemically connected to each other;
a heat radiating plate; and
a second metal layer formed between the second solder layer and the heat radiating plate, the second metal layer and the second solder layer being made molten so as to be chemically connected to each other.

2. The heat radiating component as claimed in claim 1,
wherein the linear high thermal conductivity materials include first high thermal conductivity materials and second high thermal conductivity materials;
the first high thermal conductivity materials have first end sides connected to the first solder layer;
the second high thermal conductivity materials have second end sides connected to the second solder layer;
the first high thermal conductivity materials and the second high thermal conductivity materials are alternately provided; and
the first high thermal conductivity materials are situated in respective gaps formed between the neighboring second high thermal conductive materials and the second high thermal conductivity materials are situated in respective gaps formed between the neighboring first high thermal conductivity materials.

3. The heat radiating component as claimed in claim 2,
wherein the second end sides of the first high thermal conductivity materials come in contact with a surface of the second solder layer; and
the first end sides of the second high thermal conductivity materials come in contact with a surface of the first solder layer.

4. The heat radiating component as claimed in claim 1,
wherein the linear high thermal conductivity materials are carbon nanotubes.

5. A semiconductor package, comprising:
the heat radiating component as claimed in claim 1; and
a semiconductor element facing the heat radiating plate via the thermal conductive member.

6. A manufacturing method of a heat radiating component, comprising:
providing first high thermal conductivity materials having first end sides where a first solder layer is formed and second high thermal conductivity materials having second end sides where a second solder layer is formed, so that the first high thermal conductivity materials and the second high thermal conductivity materials are alternately situated, and the first high thermal conductivity materials are situated in respective gaps formed between the neighboring second high thermal conductivity materials and the second high thermal conductivity materials are situated in respective gaps formed between the neighboring first high thermal conductivity materials;
providing a first metal layer formed under the first solder layer and configured to be formed on a semiconductor element and melting the first metal layer and the first solder layer so as to chemically connect the first metal layer to the first solder layer;

providing a heat radiating plate; and providing a second metal layer formed between the second solder layer and the heat radiating plate and melting the second metal layer and the second solder layer so as to be chemically connected the second metal layer to the second solder layer.

7. The manufacturing method of the heat radiating component as claimed in claim 6, wherein the first and the second high thermal conductivity materials are carbon nanotubes.

* * * * *